US010684831B2

(12) United States Patent
Kataoka et al.

(10) Patent No.: US 10,684,831 B2
(45) Date of Patent: Jun. 16, 2020

(54) INFORMATION PROCESSING APPARATUS, INFORMATION PROCESSING METHOD, AND RECORDING MEDIUM

(71) Applicant: FUJITSU LIMITED, Kawasaki-shi, Kanagawa (JP)

(72) Inventors: Masahiro Kataoka, Kamakura (JP); Takaki Ozawa, Numazu (JP); Kohshi Yamamoto, Kawasaki (JP); Tomohiko Hosaka, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 38 days.

(21) Appl. No.: 15/834,950

(22) Filed: Dec. 7, 2017

(65) Prior Publication Data

US 2018/0095735 A1   Apr. 5, 2018

Related U.S. Application Data

(63) Continuation of application No. PCT/JP2015/066791, filed on Jun. 10, 2015.

(51) Int. Cl.
*G06F 8/41* (2018.01)
*G06F 9/445* (2018.01)
(Continued)

(52) U.S. Cl.
CPC ............ *G06F 8/425* (2013.01); *G06F 9/445* (2013.01); *G06K 9/6282* (2013.01); *H03M 7/3088* (2013.01)

(58) Field of Classification Search
CPC ........ G06F 8/425; G06F 9/445; G06F 9/6282; H03M 7/3088
See application file for complete search history.

(56) References Cited

U.S. PATENT DOCUMENTS 5,555,179 A * 9/1996 Koyama .......... G05B 19/41835
700/95
5,577,135 A * 11/1996 Grajski ............. G06K 9/00422
382/187

(Continued)

FOREIGN PATENT DOCUMENTS

JP          61-204741          9/1986
JP          2-1027             1/1990
(Continued)

OTHER PUBLICATIONS

Tao Wang et al., "Using Compressed Bytecode Traces for Slicing Java Programs", [Online], IEEE 2004, pp. 1-10, [Retrieved from Internet on Feb. 18, 2020], <https://ieeexplore.ieee.org/stamp/stamp.jsp?arnumber=1317473>.*

(Continued)

*Primary Examiner* — Ziaul A Chowdhury
(74) *Attorney, Agent, or Firm* — Xsensus LLP

(57) ABSTRACT

An information processing apparatus includes: a processor configured to: conduct lexical analysis on an interpreter-type source code; compress a source code, on which the lexical analysis has been conducted, by using a compression dictionary that associates an internal code and a compression code; when an execution command of an interpreter is received for the source code compressed, convert the source code compressed into an internal code in accordance with the compression dictionary; and sequentially execute processing in accordance with the internal code converted.

4 Claims, 12 Drawing Sheets

(51) Int. Cl.
*G06K 9/62* (2006.01)
*H03M 7/30* (2006.01)

(56) References Cited

U.S. PATENT DOCUMENTS

| | | | |
|---|---|---|---|
| 5,590,317 A | | 12/1996 | Iguchi et al. |
| 5,742,828 A | * | 4/1998 | Canady ............ G06F 8/425 717/144 |
| 6,061,513 A | * | 5/2000 | Scandura ........... G06F 8/74 717/142 |
| 6,088,740 A | * | 7/2000 | Ghaffari ............ G06F 9/3879 710/112 |
| 6,721,753 B1 | | 4/2004 | Kataoka et al. |
| 7,065,751 B2 | * | 6/2006 | Hagiwara .......... G06F 9/445 717/139 |
| 9,225,729 B1 | * | 12/2015 | Moen ............... H04L 9/3239 |
| 9,430,200 B1 | * | 8/2016 | Trofin ............... G06F 8/443 |
| 2002/0027666 A1 | * | 3/2002 | Ikeda ............... G06K 15/02 358/1.1 |
| 2002/0109615 A1 | * | 8/2002 | Abdat .............. H03M 7/3088 341/51 |
| 2004/0108946 A1 | * | 6/2004 | Sundareson ........ H03M 7/40 341/67 |
| 2004/0243985 A1 | * | 12/2004 | Le Metayer ........ G06F 8/4434 717/139 |
| 2005/0193373 A1 | * | 9/2005 | Wannamaker ...... G06F 8/4434 717/118 |
| 2006/0034212 A1 | * | 2/2006 | Mutch .............. H03M 7/30 370/328 |
| 2006/0117307 A1 | * | 6/2006 | Averbuch ........... G06F 40/221 717/143 |
| 2006/0174333 A1 | * | 8/2006 | Thomas ............. G06F 21/62 726/9 |
| 2006/0236319 A1 | * | 10/2006 | Pinnix .............. G06F 8/71 717/170 |
| 2007/0079296 A1 | | 4/2007 | Li et al. |
| 2009/0241094 A1 | * | 9/2009 | Sikka .............. G06F 8/31 717/127 |
| 2009/0247881 A1 | | 10/2009 | Maeda et al. |
| 2010/0251224 A1 | * | 9/2010 | Cheriton ........... G06F 8/427 717/139 |
| 2011/0219357 A1 | * | 9/2011 | Livshits ............ G06F 9/445 717/115 |
| 2018/0095735 A1 | | 4/2018 | Kataoka et al. |

FOREIGN PATENT DOCUMENTS

| | | |
|---|---|---|
| JP | 5-233791 A | 9/1993 |
| JP | 5-324730 | 12/1993 |
| JP | 6-290021 | 10/1994 |
| JP | 2000-89965 | 3/2000 |
| JP | 3770919 | 4/2006 |
| JP | 2008-259507 | 10/2008 |
| JP | 2009-254794 | 11/2009 |
| WO | 2016/199255 A1 | 12/2016 |

OTHER PUBLICATIONS

Johan Runeson, "Code Compression through Procedural Abstraction before Register Allocation", [Online], 2000, pp. 1-21, [Retrieved from Internet on Feb. 18, 2020], <http://citeseerx.ist.psu.edu/viewdoc/download?doi=10.1.1.35.9105&rep=rep1&type=pdf>.*

Siqin Chen et al., "Static Testing as a Service on Cloud", [Online], 2013, pp. 638-642, [Retrieved from from Interent on Feb. 18, 2020], <https://ieeexplore.ieee.org/stamp/stamp.jsp?arnumber=6550468>.*

Australian Office Action dated Sep. 12, 2018 in Patent Application No. 2015398151, 3 pages.

International Search Report dated Sep. 8, 2015 in PCT/JP2015/066791, filed on Jun. 10, 2015 (with English Translation).

Written Opinion dated Sep. 8, 2015 in PCT/JP2015/066791, filed on Jun. 10, 2015.

Extended European Search Report dated May 4, 2018 in European Patent Application No. 15894940.4, 7 pages.

Australian Office Action dated Jan. 30, 2019 in Australian Patent Application No. 2015398151.

Japanese Office Action dated Jan. 14, 2020, issued in corresponding Japanese Application No. 2018-200431.

* cited by examiner

FIG.5

| CONTENT | BYTE LENGTH | INTERNAL CODE | |
|---|---|---|---|
| IF<br>For<br>THEN<br>⋮ | 2<br>3<br>4<br>⋮ | 01<br>02<br>03<br>⋮ | RESERVED WORD 1 (CONTROL STATEMENT) |
| =<br>+<br>−<br>⋮ | 1<br>1<br><br>⋮ | 20<br>21<br>22<br>⋮ | RESERVED WORD 2 (OPERATOR) |
| int_max<br>int_min<br>⋮ | <br><br>⋮ | 10<br>11<br>⋮ | VARIABLE 1 (NUMERICAL VARIABLE) |
| 100<br>1000<br>⋮ | 3<br>4<br>⋮ | 30<br>31<br>⋮ | VARIABLE 2 (CONSTANT) |
| proc_abc<br>sub_a<br>⋮ | 8<br>5<br>⋮ | 40<br>41<br>⋮ | VARIABLE 3 (ADDRESS VARIABLE) |

FIG.6

| HEADER SECTION | COMPRESSED CODE DATA |
|---|---|

INFORMATION PROCESSING APPARATUS, INFORMATION PROCESSING METHOD, AND RECORDING MEDIUM

CROSS-REFERENCE TO RELATED APPLICATION

This application is a continuation application of International Application PCT/JP2015/066791, filed on Jun. 10, 2015, and designating the U.S., the entire contents of which are incorporated herein by reference.

FIELD

The present invention relates to an information processing apparatus, or the like.

BACKGROUND

Upon execution of programs that are described in an interpreter-type program language, an information processing apparatus conducts lexical analysis on the source code of the program and conducts assignment of an internal code in accordance with a result of the lexical analysis. Then, the information processing apparatus sequentially performs processing in accordance with the assigned internal code.

Furthermore, source codes are sometimes stored in a compressed state. In such a case, upon execution of a compressed interpreter-type source code, the information processing apparatus performs a process to decompress the source code and then conducts lexical analysis and assignment of an internal code.

Patent Document 1: Japanese Laid-open Patent Publication No. 6-290021
Patent Document 2: Japanese Laid-open Patent Publication No. 5-324730
Patent Document 3: Japanese Laid-open Patent Publication No. 2-1027

SUMMARY

According to an aspect of the embodiments, an information processing apparatus includes: a processor configured to: conduct lexical analysis on an interpreter-type source code; compress a source code, on which the lexical analysis has been conducted, by using a compression dictionary that associates an internal code and a compression code; when an execution command of an interpreter is received for the source code compressed, convert the source code compressed into an internal code in accordance with the compression dictionary; and sequentially execute processing in accordance with the internal code converted.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a diagram that illustrates an example of the data structure of an internal-code correspondence table according to the embodiment;
FIG. 6 is a diagram that illustrates an example of the block configuration of a compression file.

DESCRIPTION OF EMBODIMENTS

However, in a case where the interpreter-type source code is stored in a compressed state, source code decompression and lexical analysis are repeated each time a program is executed; therefore, there is a problem in that a process from execution command until execution completion is time-consuming, and resources are wasted.

Figure 1:
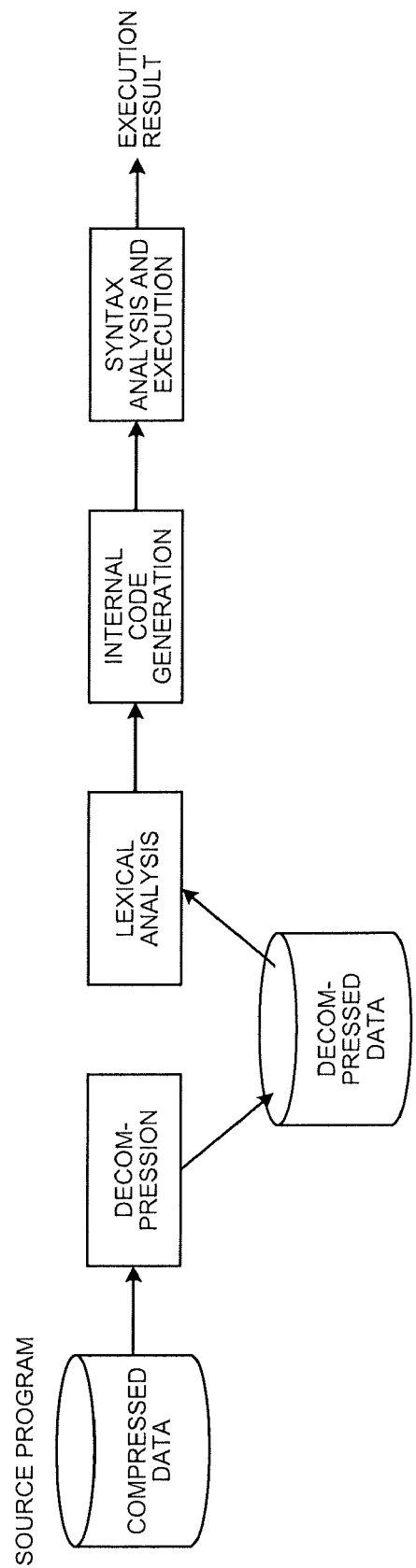
FIG. 1 is a reference diagram that illustrates the sequence of interpreter execution.

Here, with reference to FIG. 1, an explanation is given of the problem in that, in a case where a source code is stored in a compressed state, a process from execution command for the source code until execution completion is time-consuming and resources are wasted. FIG. 1 is a reference diagram that illustrates the sequence of interpreter execution. As illustrated in FIG. 1, the information processing apparatus stores the decompression data, which is decompressed from the entire compressed data on the source program stored in a compressed state, in the memory area. Then, the information processing apparatus conducts lexical analysis and internal code generation on the entire decompression data, stored in the memory area, and further conducts syntax analysis and interpreter execution based on the generated internal code. Thus, the information processing apparatus decompresses the entire compressed data and then conducts lexical analysis and internal code generation on the decompressed decompression data, whereby the process from execution command for the source code until execution completion is time-consuming.

According to one aspect, there is an object to improve the efficiency in execution of an interpreter for interpreter-type source codes.

With reference to the drawings, a detailed explanation is given below of embodiments of an information processing apparatus, an information processing method, and an information processing program, disclosed in the subject application. Furthermore, the present invention is not limited to the embodiments.

[Example of the Sequence of Interpreter Execution According to an Embodiment]

Figure 2:
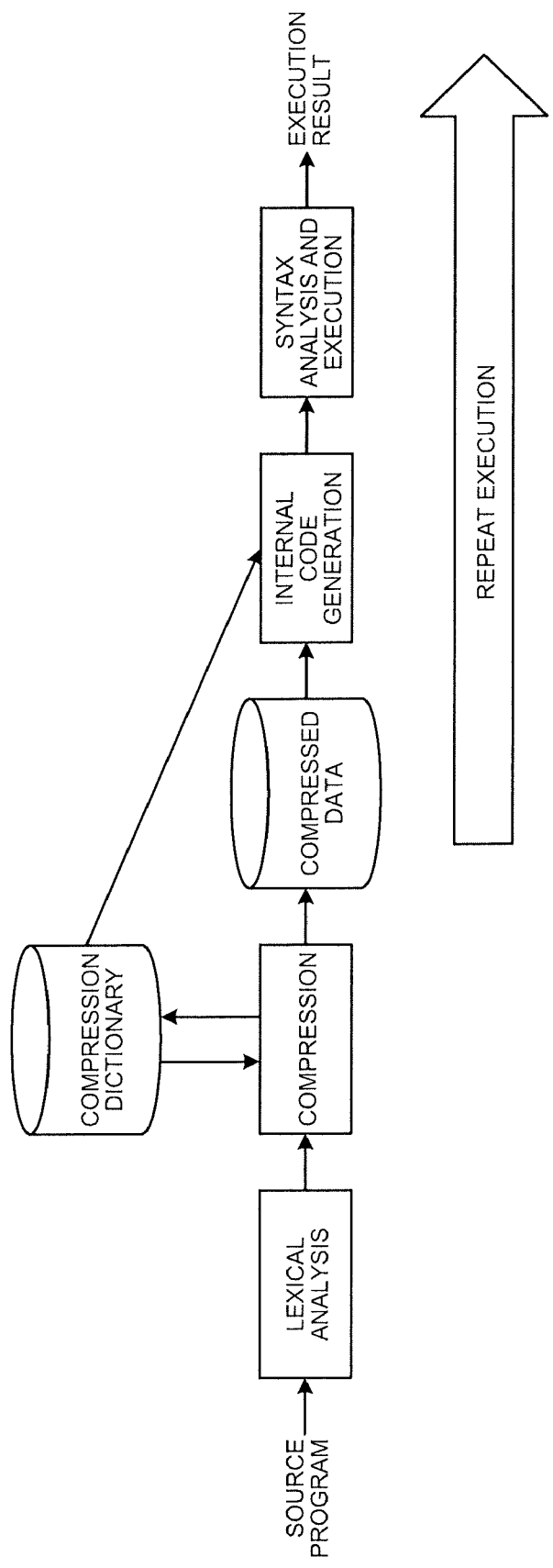
FIG. 2 is a diagram that illustrates an example of the sequence of interpreter execution according to an embodiment.

FIG. 2 is a diagram that illustrates an example of the sequence of interpreter execution according to an embodiment. As illustrated in FIG. 2, during an interpreter compression process, lexical analysis is conducted on an interpreter-type source program, and a lexical-analysis result is associated with an internal code, is assigned with a compression code, and is stored in a compression file. Then, during an interpreter execution process, in a state where the source program is still compressed, syntax analysis and interpreter execution are conducted after internal-code conversion.

For example, in the information processing apparatus, when an interpreter-type source program is compressed, lexical analysis is conducted on the source program. The lexical analysis mentioned here means that a source program, which is not in a compressed state, is divided into words. The words include reserved words, which indicate already reserved words, variables, line breaks, and comments. The reserved words include control statements and operators. Examples of the control statement include for and while. Examples of the operator include +, −, ×, /, =. The variables include variables (numerical variables) that indicate numerical numbers, constants, or variables (address variables) that indicate addresses. Examples of the numerical variable include int_max or int_min. Examples of the constant include 100 or 1000. Examples of the address variable include proc_abc or sub_a.

The information processing apparatus compresses a word, divided during the lexical analysis, by using the compression dictionary that associates internal codes and compression codes. The internal code mentioned here means an internal code that is used when the interpreter is executed. By associating internal codes and compression codes in the compression dictionary, compression codes may be converted into internal codes while the compressed source program is still in a compressed state. Then, the information processing apparatus stores compressed data in a memory area.

The information processing apparatus converts the compressed data, stored in the memory area, into an internal code by using the compression dictionary that associates internal codes and compression codes. Then, the information processing apparatus conducts syntax analysis and interpreter execution on the converted internal code. Thus, if an interpreter-type source code is stored in a compressed state, there may be an improvement in the execution speed from the execution command of an interpreter to the execution completion. In other words, as there is not always a match between the internal code suitable for the actual source program execution and the compression code (compression sign) for the purpose of compression, the information processing apparatus assigns codes and generates the correspondence relationship with internal codes suitable for execution in the compression dictionary in a state where lexical analysis has completed. This allows the information processing apparatus to use the regularity of the source program obtained during lexical analysis for both file-size reduction and code conversion for program execution.

[Flow of the Compression Process According to the Embodiment]

Figure 3:
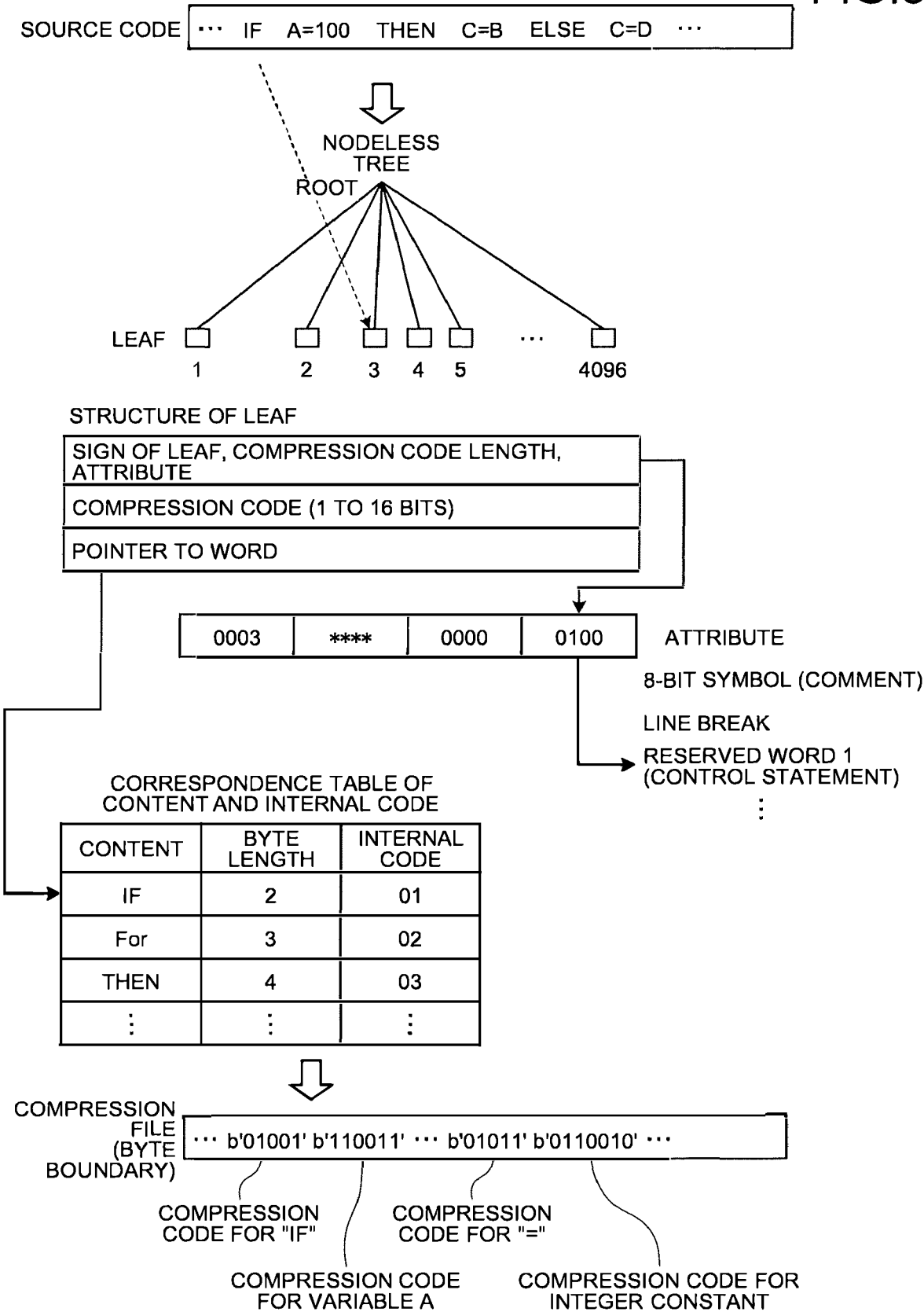
FIG. 3 is a diagram that illustrates the flow of the compression process according to the embodiment.

FIG. 3 is a diagram that illustrates the flow of the compression process according to the embodiment. In FIG. 3, the interpreter-type source program includes for example the data " . . . IF A=100 THEN C=B ELSE C=D . . . ".

As illustrated in FIG. 3, the information processing apparatus conducts lexical analysis on the interpreter-type source program. For example, the information processing apparatus divides the source program into "IF", "A", "=", "100", "THEN", "C", "=", "B", "ELSE", "C", "=", "D" . . . .

The information processing apparatus classifies the identifiers of divided words for each attribute. The attribute mentioned here includes, for example, reserved word, variable, line break, or comment. The reserved word is divided into, for example, a control statement and an operator. The variable is divided into, for example, a numerical variable, a constant, and an address variable. Here, "IF", "THEN", and "ELSE" are classified into the control statement of the reserved word. "=" is classified into the operator of the reserved word. "A", "B", and "C" are classified into the numerical variable of the variable. "100" is classified into the constant of the variable.

The information processing apparatus assigns the classified identifiers of the words for each attribute to the respective leaves that constitute the nodeless tree that is equivalent to the compression dictionary. Here, it is assumed that the control statement "IF" of the reserved word is assigned to the third leaf of the nodeless tree. Then, the information processing apparatus sets the bit that indicates reserved word 1 (control statement) to "1" (ON) in the attribute area of the third leaf. Then, the information processing apparatus sets the pointer to the area, in which the substance of "IF" is stored, as the pointer to the word in the third leaf. The pointer refers to for example the content of an internal-code correspondence table that relates a substance (content) and an internal code. That is, the pointer associates a compression code and an internal code.

The information processing apparatus aggregates the appearance frequency of the character string of a word or a symbol in accordance with classification for each attribute. Then, in accordance with classification for each attribute, the information processing apparatus assigns a shorter compression code to a word with a higher appearance frequency. That is, the information processing apparatus conducts entropy coding with the appearance frequency of a word. The information processing apparatus sets the compression code, which is assigned to a word, in the compression code area of the leaf that is related to the word. The information processing apparatus sets the code length of the compression code, assigned to a word, as the compression code length in the leaf.

The information processing apparatus conducts compression coding on a source code by using a generated nodeless tree. The information processing apparatus stores compressed data in a compression file.

[Data Structure of the Structure of a Leaf]

Figure 4:
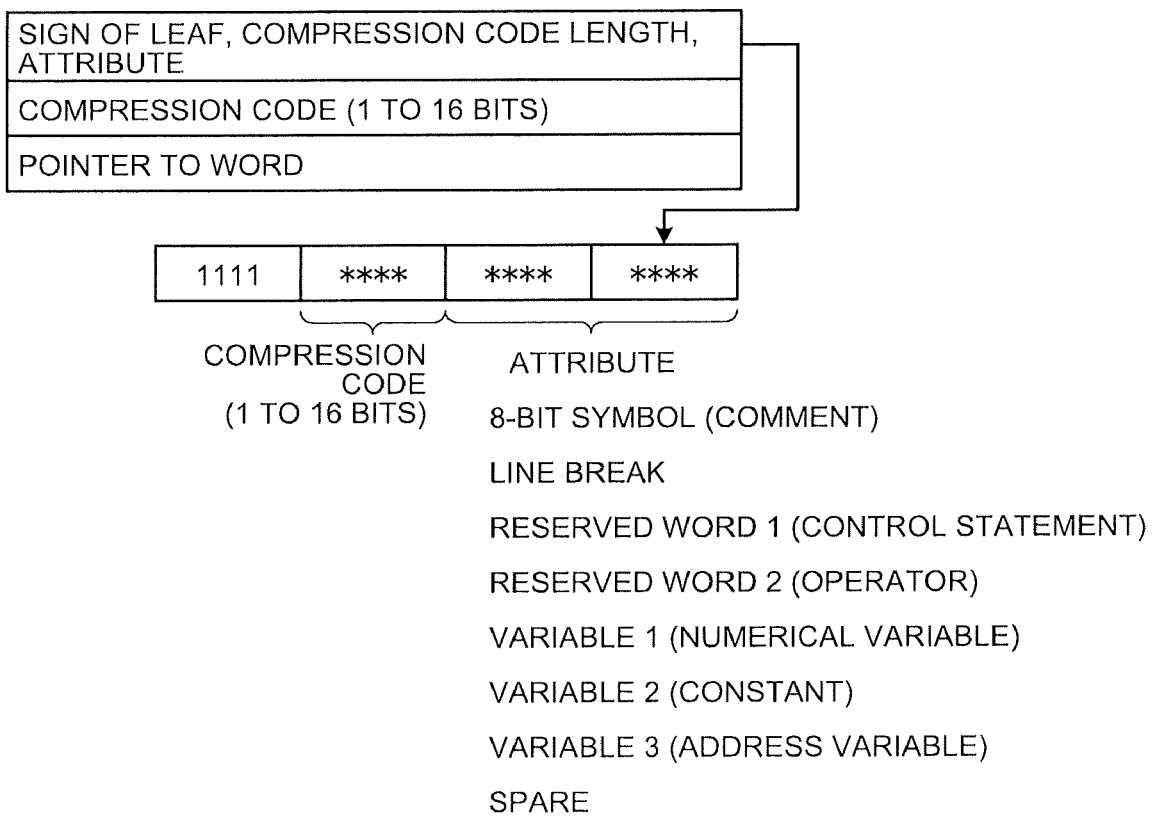
FIG. 4 is a diagram that illustrates an example of the data structure of the structure of a leaf according to the embodiment.

FIG. 4 is a diagram that illustrates an example of the data structure of the structure of a leaf according to the embodiment. As illustrated in FIG. 4, the structure of the leaf stores a leaf sign, a compression code length, an attribute, a compression code, and a pointer to a word. The leaf sign is the information for uniquely identifying a leaf. The compression code length is the code length of a compression code. The attribute is the information that indicates the attribute of a word. The attribute includes 8-bit symbol (comment), line break, reserved word 1 (control statement), reserved word 2 (operator), variable 1 (numerical variable), variable 2 (constant), and variable 3 (address variable). Each attribute corresponds to each bit, and the corresponding bit is set to 1 (ON) in accordance with the attribute of a word.

[Data Structure of the Internal-Code Correspondence Table]

FIG. 5 is a diagram that illustrates an example of the data structure of the internal-code correspondence table according to the embodiment. As illustrated in FIG. 5, the internal-code correspondence table stores a content, a byte length, and an internal code in a related manner. The content is the character string of a word. The byte length is the byte length of the content. The internal code is the internal code that is related to the content. The internal code is assigned in accordance with classification for each attribute. For example, if the attribute is the reserved word 1 (control statement), assignment starts from "01", if the attribute is the variable 1 (numerical variable), assignment starts from "10" and, if the attribute is the reserved word 2 (operator), assignment starts from "20". For example, if the content is "IF", "01" is assigned as an internal code. Furthermore, the internal-code correspondence table is previously generated and stored.

[Block Configuration of a Compression File]

FIG. 6 is a diagram that illustrates an example of the block configuration of a compression file. As illustrated in FIG. 6, a compression file includes a header section and compressed code data. Compressed code data corresponds to each compression code generated by the information processing apparatus. The header section includes, for example, the information for identifying the compression algorithm that is used to generate a compression file or information, such as parameters, used for compression. For example, the header section stores the character string of a word, the attribute of the word, and the appearance frequency in a related manner. This is because there is a need to generate a nodeless tree when the information processing apparatus executes the interpreter.

[Flow of an Internal-Code Conversion Process According to the Embodiment]

Figure 7:
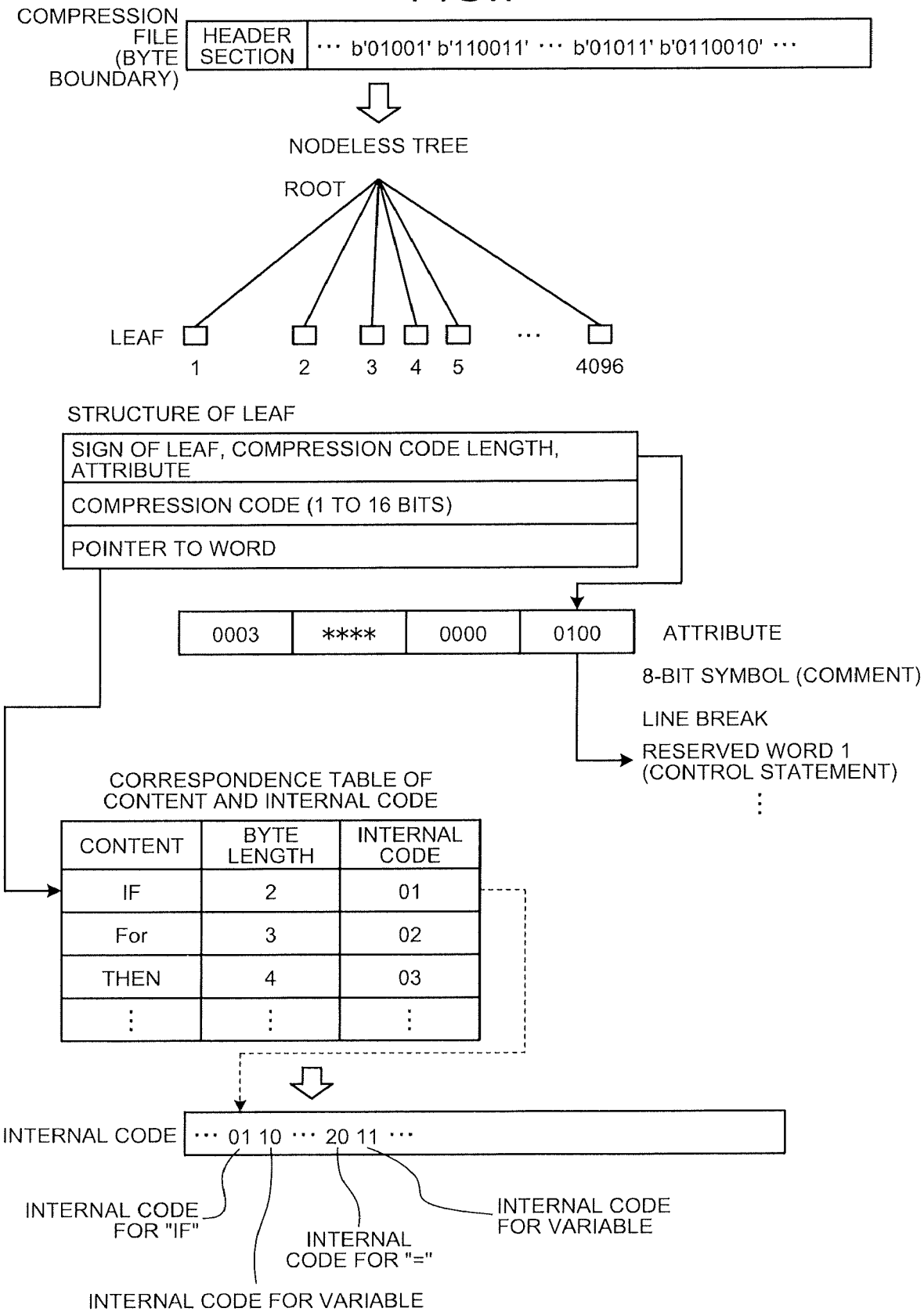
FIG. 7 is a diagram that illustrates the flow of an internal-code conversion process according to the embodiment.

FIG. 7 is a diagram that illustrates the flow of an internal-code conversion process according to the embodiment. As illustrated in FIG. 7, the information processing apparatus generates a nodeless tree by using the information stored in the header section of a compression file. For example, the information processing apparatus assigns the character string of a word to a leaf that builds the nodeless tree. The information processing apparatus sets the attribute of the word to "1" (ON) in the attribute area of the leaf. The information processing apparatus sets the pointer to the area with the content that matches the character string of the word, stored in the internal-code correspondence table, as the pointer to the word in the leaf. The information processing apparatus sets the compression code assigned based on the appearance frequency of the word as the compression code in the leaf and sets the code length of the compression code as the compression code length in the leaf. That is, the information processing apparatus conducts entropy coding with the appearance frequency of a word and sets the compression code, which is encoded, as the compression code in the leaf.

The information processing apparatus uses the generated nodeless tree to conducts internal coding on the compressed code data in a compression file. For example, the information processing apparatus sequentially reads a compression code from compressed code data. The information processing apparatus compares the bit sequence of the read compression code with the bit sequence of the compression code that is assigned to the leaf, thereby identifying the leaf that is connected to the branch that is hit by the bit sequence of the read compression code. The information processing apparatus acquires the internal code that is related to the content that is designated by the pointer to the word in the identified leaf. That is, the information processing apparatus converts the read compression code into an internal code.

The information processing apparatus conducts syntax analysis and interpreter execution by using the converted internal code on a per-line basis. One line includes internal codes that correspond to compression codes from "line break" to the next "line break". Thus, if an interpreter-type source program is stored in a compressed state, the information processing apparatus directly converts it in a compressed state into an internal code without decompressing the compressed state, whereby the execution speed of the interpreter may be improved. That is, the information processing apparatus may improve the execution speed from the execution command of an interpreter to the execution completion.

Furthermore, the information processing apparatus may conduct syntax analysis by using the attributes of the leaves that correspond to compression codes on a per-line basis and execute the interpreter by using the internal codes that correspond to the respective compression codes. Thus, the information processing apparatus conducts syntax analysis by using the attribute of a leaf, whereby the execution speed of the interpreter may be furthermore improved.

[Functional Configuration of the Information Processing Apparatus]

Figure 8:
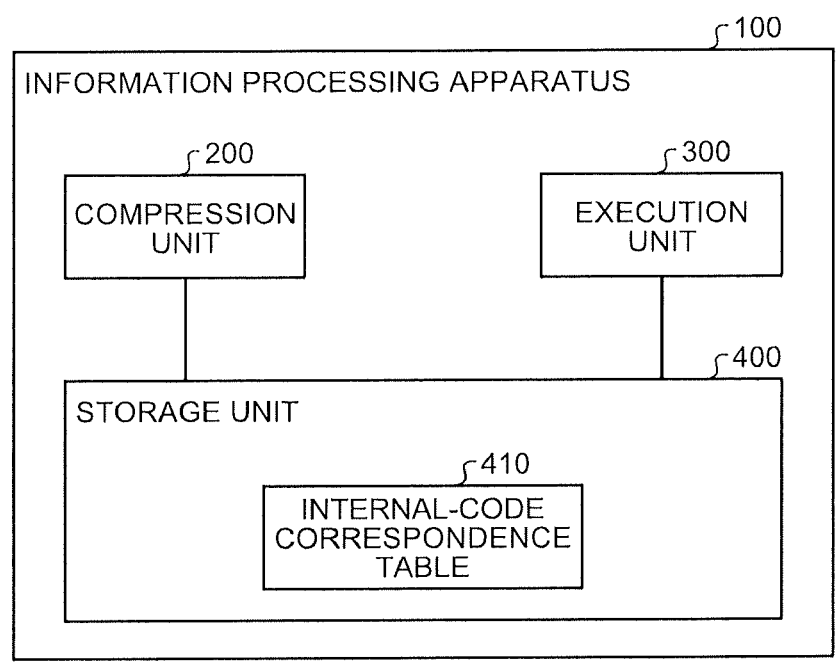
FIG. 8 is a block diagram that illustrates a functional configuration of an information processing apparatus according to the embodiment.

FIG. 8 is a block diagram that illustrates a functional configuration of the information processing apparatus according to the embodiment. As illustrated in FIG. 8, an information processing apparatus 100 includes a compression unit 200 and an execution unit 300.

The compression unit 200 is a processing unit that performs the compression process illustrated in FIG. 3. The execution unit 300 is a processing unit that executes the interpreter that includes the internal-code conversion process illustrated in FIG. 7. A storage unit 400 stores an internal-code correspondence table 410. As the internal-code correspondence table 410 has the same data structure as that illustrated in FIG. 5, its explanation is omitted.

[Functional Configuration of the Compression Unit]

Figure 9:
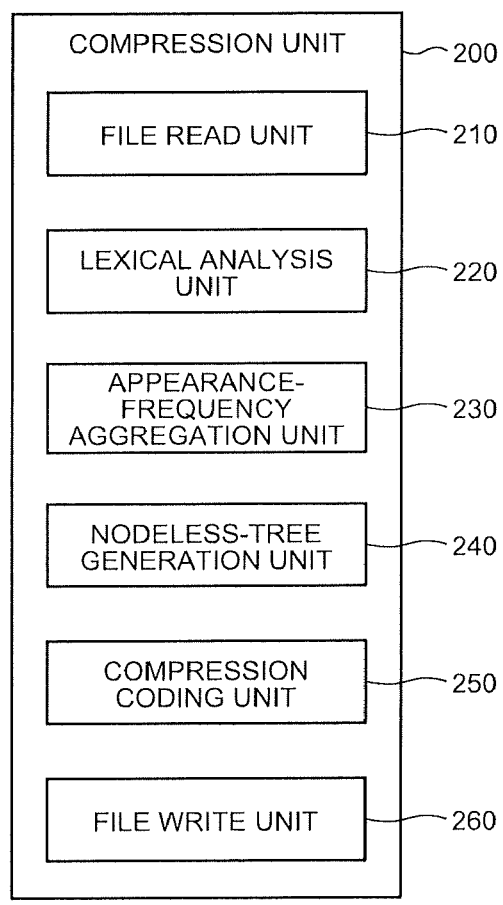
FIG. 9 is a block diagram that illustrates a functional configuration of a compression unit according to the embodiment.

FIG. 9 is a block diagram that illustrates a functional configuration of the compression unit according to the embodiment. As illustrated in FIG. 9, the compression unit 200 includes a file read unit 210, a lexical analysis unit 220, an appearance-frequency aggregation unit 230, a nodeless-tree generation unit 240, a compression coding unit 250, and a file write unit 260.

The file read unit 210 reads an interpreter-type source program within the file. The file read unit 210 outputs the read source program to the lexical analysis unit 220 and the compression coding unit 250.

The lexical analysis unit 220 conducts lexical analysis on the source program. For example, the lexical analysis unit 220 divides the source program on a per word basis. The lexical analysis unit 220 classifies the divided word into an attribute. The lexical analysis unit 220 outputs the classification for each attribute to the appearance-frequency aggregation unit 230 and the nodeless-tree generation unit 240.

In accordance with classification for each attribute, the appearance-frequency aggregation unit 230 aggregates the appearance frequency of the character string of the word or the symbol that belongs to the class. The appearance-frequency aggregation unit 230 assigns a shorter compression code to a word with a higher appearance frequency aggregated in accordance with classification for each attribute. That is, the appearance-frequency aggregation unit 230 conducts entropy coding with the appearance frequency of a word.

The nodeless-tree generation unit 240 generates a nodeless tree in accordance with an attribute. For example, the nodeless-tree generation unit 240 assigns a word for each attribute, classified by the lexical analysis unit 220, to a leaf that builds a nodeless tree. The nodeless-tree generation unit 240 sets the attribute of the word in the attribute area that is related to the leaf of the word. The nodeless-tree generation unit 240 sets the pointer that indicates the character string of the word as the pointer to the word, which is related to the leaf of the word. Specifically, the nodeless-tree generation unit 240 sets the pointer to the area with the content that matches the character string of the word, stored in the internal-code correspondence table 410, as the pointer to the word. The nodeless-tree generation unit 240 sets the compression code assigned by the appearance-frequency aggregation unit 230 as the compression code related to the leaf of the word and sets the code length of the compression code as the compression code length related to the leaf of the word. The nodeless-tree generation unit 240 outputs the generated nodeless tree to the compression coding unit 250.

The compression coding unit 250 conducts compression coding on the source program by using the generated nodeless tree. The compression coding unit 250 outputs compressed code data on the source program to the file write unit 260.

The file write unit 260 writes the compressed code data on the source program into a compression file. In the header section of the compression file, the file write unit 260 writes the character string of the word and the attribute of the word, classified for each attribute by the lexical analysis unit 220, together with the appearance frequency aggregated by the appearance-frequency aggregation unit 230.

[Functional Configuration of the Execution Unit]

Figure 10:
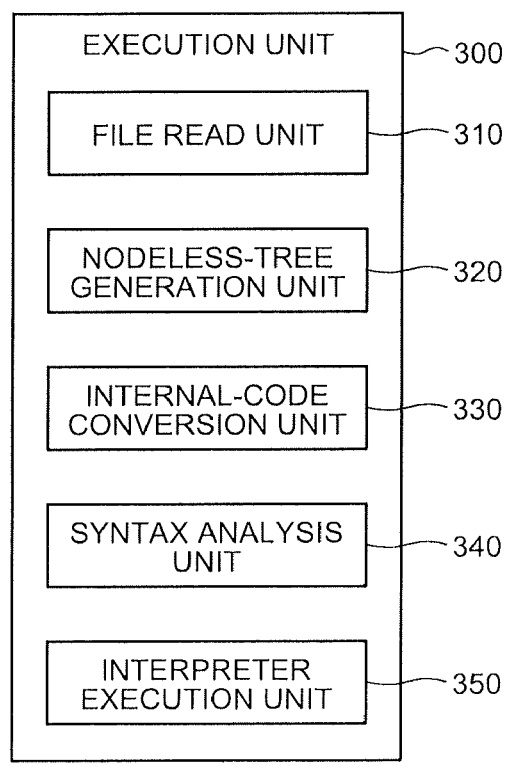
FIG. 10 is a block diagram that illustrates a functional configuration of an execution unit according to the embodiment.

FIG. 10 is a block diagram that illustrates a functional configuration of the execution unit according to the embodiment. As illustrated in FIG. 10, the execution unit 300 includes a file read unit 310, a nodeless-tree generation unit 320, an internal-code conversion unit 330, a syntax analysis unit 340, and an interpreter execution unit 350.

When the file read unit 310 receives an execution command for the compression file, it reads the compression file, for which the execution command has been received. The file read unit 310 outputs the read compression file to the nodeless-tree generation unit 320 and the internal-code conversion unit 330.

The nodeless-tree generation unit 320 generates a nodeless tree by using the information stored in the header section of a compression file. The information stored in the header section includes the character string of each word, the attribute, and the appearance frequency. For example, the nodeless-tree generation unit 320 assigns the character string of a word to a leaf that builds the nodeless tree. The nodeless-tree generation unit 320 sets the attribute of the word to "1" (ON) in the attribute area of the leaf. The nodeless-tree generation unit 320 sets the pointer to the area with the content that matches the character string of the word, stored in the internal-code correspondence table 410, as the pointer to the word in the leaf. The nodeless-tree generation unit 320 sets the compression code assigned based on the appearance frequency of the word as the compression code in the leaf and sets the code length of the compression code as the compression code length in the leaf. That is, the nodeless-tree generation unit 320 conducts entropy coding with the appearance frequency of a word and sets the compression code, which is encoded, as the compression code in the leaf. The nodeless-tree generation unit 320 outputs the generated nodeless tree to the internal-code conversion unit 330.

The internal-code conversion unit 330 conducts internal coding on the compressed code data in a compression file by using a generated nodeless tree. For example, the internal-code conversion unit 330 sequentially reads a compression code from compressed code data. The internal-code conversion unit 330 compares the bit sequence of the read compression code with the bit sequence of the compression code that is assigned to the leaf of the nodeless tree, thereby identifying the leaf that is connected to the branch that is hit by the bit sequence of the read compression code. The internal-code conversion unit 330 acquires the internal code that is related to the content in the internal-code correspondence table 410, designated by the pointer to the word in the identified leaf. That is, the internal-code conversion unit 330 converts the read compression code into an internal code. The internal-code conversion unit 330 outputs the converted internal code to the syntax analysis unit 340.

The syntax analysis unit 340 conducts syntax analysis by using the converted internal code on a per-line basis. For example, the syntax analysis unit 340 conducts syntax analysis by using internal codes from the internal code of "line break" to the internal code of the next "line break". The syntax analysis unit 340 outputs internal codes for one line to the interpreter execution unit 350. Furthermore, the syntax analysis unit 340 may conduct syntax analysis by using the attributes of the leaves that correspond to compression codes from "line break" to the next "line break".

The interpreter execution unit 350 executes the interpreter by using internal codes for one line. Furthermore, if syntax analysis is conducted by using the attributes of the leaves that correspond to compression codes for one line, the interpreter execution unit 350 may execute the interpreter by using the respective internal codes that correspond to the compression codes for one line.

[Flowchart of the Compression Process]

Figure 11:
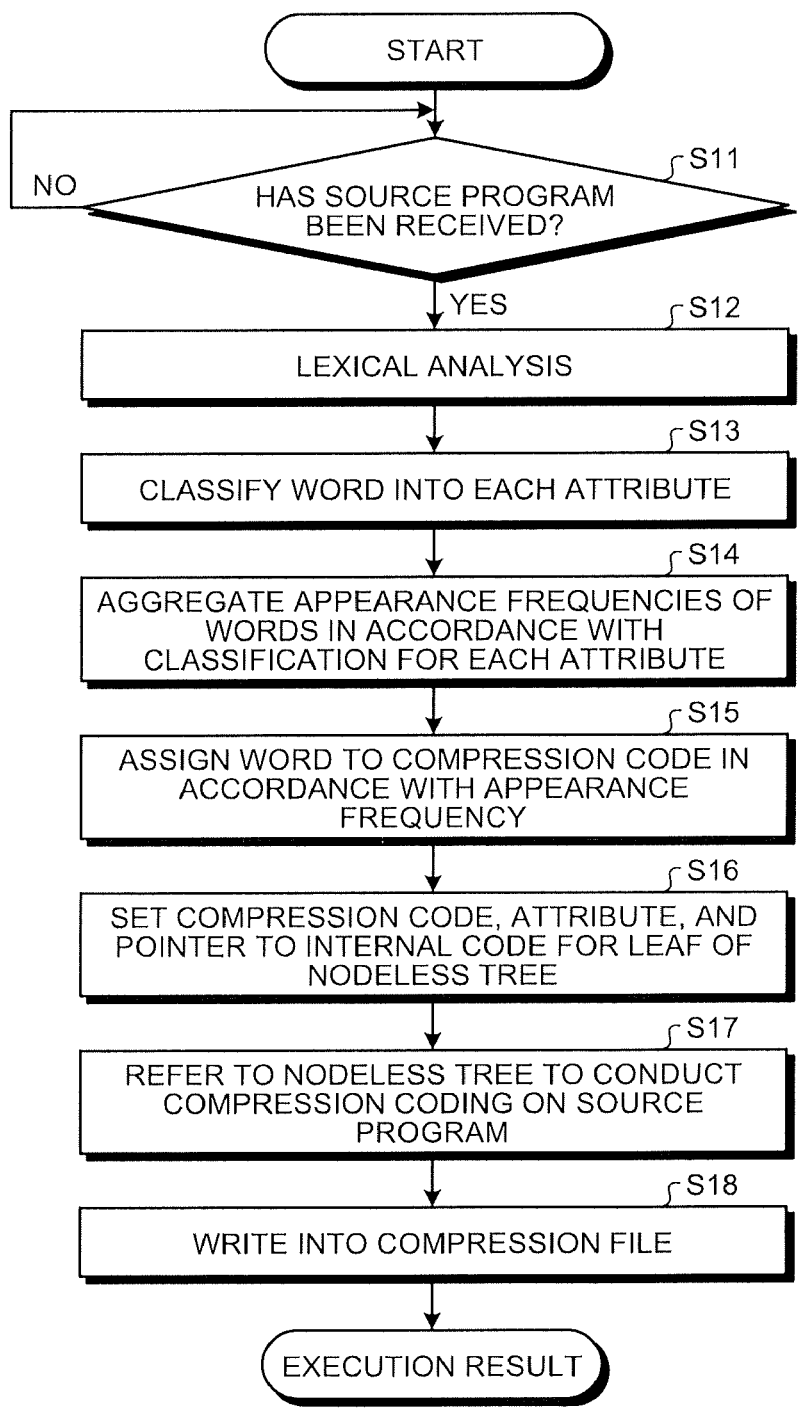
FIG. 11 is a diagram that illustrates an example of the flowchart of the compression process according to the embodiment.

FIG. 11 is a diagram that illustrates an example of the flowchart of the compression process according to the embodiment.

First, the information processing apparatus 100 determines whether a source program has been received (Step S11). If it is determined that no source program has been received (Step S11; No), the information processing apparatus 100 repeats the determination process until a source program is received.

Conversely, if it is determined that a source program has been received (Step S11; Yes), the information processing apparatus 100 conducts lexical analysis on the received source program (Step S12).

Then, the information processing apparatus 100 classifies each token (word), which has undergone lexical analysis, into each attribute (Step S13). The information processing apparatus 100 aggregates the appearance frequencies of the words that belong to a class in accordance with classification for each attribute (Step S14). The information processing apparatus 100 assigns each word to a compression code in accordance with the appearance frequency (Step S15). Specifically, the information processing apparatus 100 assigns a shorter compression code to a word with a higher appearance frequency aggregated in accordance with classification for each attribute.

Then, the information processing apparatus 100 assigns each word, which has undergone lexical analysis, to a leaf of the nodeless tree and sets the compression code, the attribute, and the pointer to the internal code for the assigned leaf of the nodeless tree (Step S16). For example, for each word, the information processing apparatus 100 sets the attribute of the word in the attribute area that is related to the leaf of the word. The information processing apparatus 100 sets the pointer that indicates the character string of the word as the pointer to the word that is related to the leaf of the word. Specifically, the information processing apparatus 100 sets the pointer to the area with the content that matches the character string of the word, stored in the internal-code correspondence table 410, as the pointer to the word. The information processing apparatus 100 sets the compression code, which is assigned in accordance with the appearance frequency, as the compression code that is related to the leaf of the word and sets the code length of the compression code as the compression code length that is related to the leaf of the word.

Then, the information processing apparatus 100 refers to the nodeless tree to conduct compression coding on the received source program (Step S17).

Then, the information processing apparatus 100 writes the compressed code data on the source program into a compression file (Step S18). In addition, the information processing apparatus 100 writes the character string of each word, which has undergone lexical analysis, and the attribute into the header section of the compression file together with the frequency appearance.

[Flowchart of an Execution Process]

Figure 12:
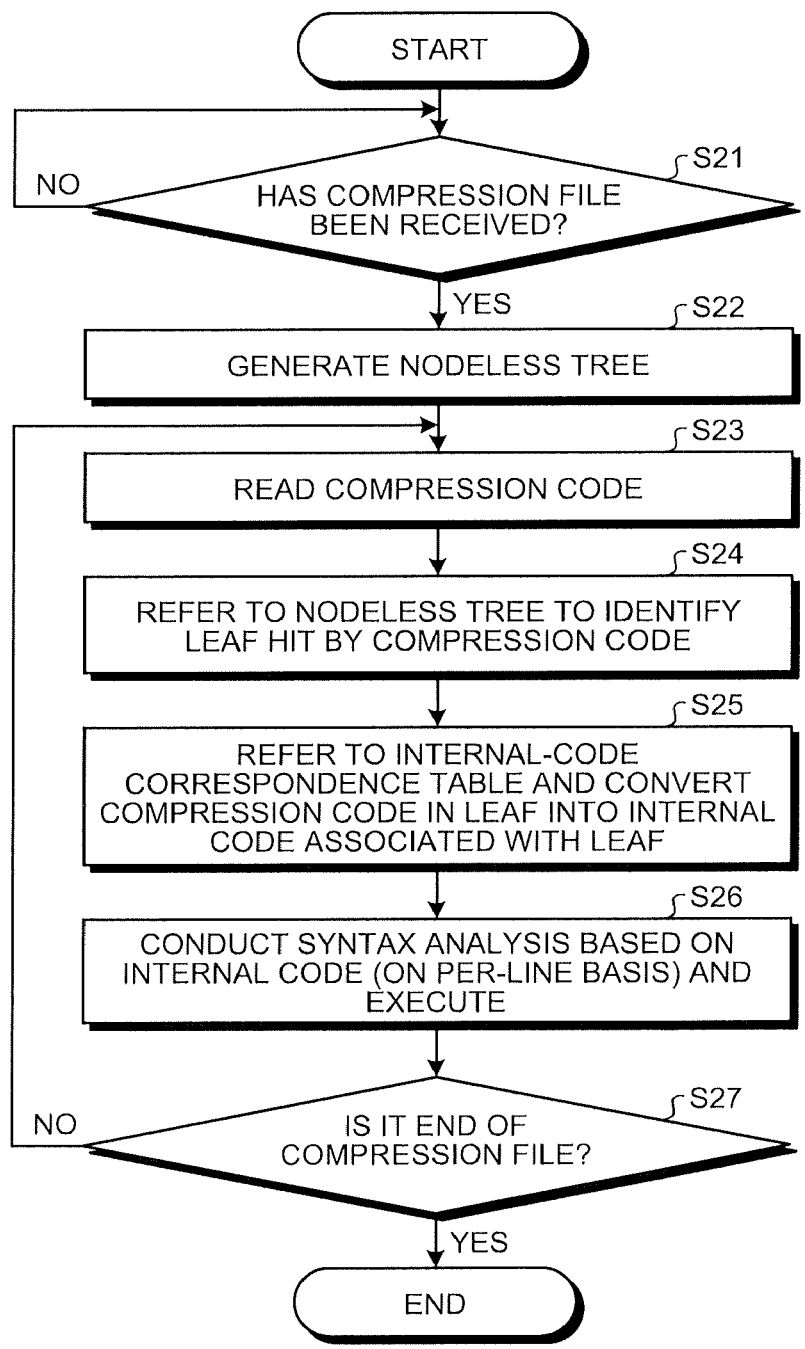
FIG. 12 is a diagram that illustrates an example of the flowchart of the execution process according to the embodiment.

FIG. 12 is a diagram that illustrates an example of the flowchart of the compression process according to the embodiment.

As illustrated in FIG. 12, the information processing apparatus 100 determines whether a compression file has been received (Step S21). If it is determined that no compression file has been received (Step S21; No), the information processing apparatus 100 repeats a determination process until a compression file is received.

Conversely, if it is determined that a compression file has been received (Step S21; Yes), the information processing apparatus 100 generates a nodeless tree (Step S22). For example, the information processing apparatus 100 generates a nodeless tree by using the information stored in the header section of the compression file.

Then, the information processing apparatus 100 reads the compression code from the compressed code data in the compression file (Step S23). The information processing apparatus 100 refers to the generated nodeless tree to identify the leaf that is hit by the read compression code (Step S24).

Then, the information processing apparatus 100 refers to the internal-code correspondence table 410 and converts the compression code in the identified leaf into the internal code that is associated with the leaf (Step S25). For example, the information processing apparatus 100 acquires the internal code that is related to the content in the internal-code correspondence table 410, indicated by the pointer to the word in the identified leaf.

Then, the information processing apparatus 100 conducts syntax analysis based on the converted internal code on a per-line basis and executes the interpreter (Step S26). For example, the information processing apparatus 100 conducts syntax analysis by using internal codes from the internal code of "line break" to the internal code of the next "line break". The information processing apparatus 100 executes the interpreter by using multiple internal codes. Furthermore, the information processing apparatus 100 may conduct syntax analysis based on the attribute in the leaf that is related to a compression code on a per-line basis.

Then, the information processing apparatus 100 determines whether it is the end of the compressed code data in the compression file (Step S27). If it is determined that it is not the end of the compressed code data in the compression file (Step S27; No), the information processing apparatus 100 proceeds to Step S23 so as to read the next compression code.

Conversely, if it is determined that it is the end of the compressed code data in the compression file (Step S27; Yes), the information processing apparatus 100 terminates the execution process.

[Advantage of the Embodiment]

According to the above-described embodiment, the information processing apparatus 100 conducts lexical analysis on an interpreter-type source code. The information processing apparatus 100 compresses the source code, on which the lexical analysis has been conducted, by using the compression dictionary that associates an internal code and a compression code. If an execution command of the interpreter is received for the compressed source code, the information processing apparatus 100 converts the compressed source code into an internal code on the basis of the compression dictionary. Then, the information processing apparatus 100 sequentially performs processing in accordance with the converted internal code. With this configuration, without decompressing a compressed source code, the information processing apparatus 100 may convert it in a compressed state into an interpreter's internal code by using the compression dictionary that associates an internal code and a compression code. As a result, the information processing apparatus 100 may improve the execution speed of the interpreter for the compressed source code.

Furthermore, according to the above-described embodiment, for each word that has undergone lexical analysis, the information processing apparatus 100 generates a tree structure whose leaf includes the compression code that is related to each word, the attribute, and the pointer to an internal code. The information processing apparatus 100 conducts syntax analysis on the basis of the attribute that is related to the word registered in the generated tree structure and executes the interpreter process in accordance with the internal code that is related to the word. With this configuration, the information processing apparatus 100 is capable of quickly determining the compression code and the attribute, thereby achieving an increase in the speed of syntax analysis.

Furthermore, according to the above-described embodiment, the information processing apparatus 100 stores each word, whose source code has undergone lexical analysis, in the header section of the compression file in relation to the attribute and the appearance frequency in the source code. With this configuration, the information processing apparatus 100 may use the information stored in the header section of the compression file to generate a nodeless tree before the interpreter is executed. As a result, by using a nodeless tree, the information processing apparatus 100 may improve the execution speed of the interpreter for the compressed source code.

[Another Aspect Associated with the Embodiment]

An explanation is given below of part of a modified example of the above-described embodiment. In addition to the modified example described below, design changes are appropriately made without departing from the scope of the present invention.

Furthermore, an explanation is given of that the information processing apparatus 100 according to the embodiment generates a nodeless tree as a tree structure that is equivalent to the compression dictionary. However, this is not a limitation, and the information processing apparatus 100 may generate a Huffman tree as a tree structure that is equivalent to the compression dictionary. Specifically, the information processing apparatus 100 may assign words for each attribute into the respective leaves that constitute the Huffman tree that corresponds to the compression dictionary and set the compression code of the corresponding word, the attribute, and the pointer to the word for each of the leaves. Furthermore, the information processing apparatus 100 may use the generated Huffman tree to conduct internal coding on a source code in a compressed state and use an internal code to conduct syntax analysis and interpreter execution.

Furthermore, when a source program is compressed, the information processing apparatus 100 according to the embodiment writes the compressed code data on the source program into a compression file and, in addition, writes the character string and the attribute of a word together with the appearance frequency into the header section of the compression file on a per word basis. Furthermore, when the compressed source program is executed, the information processing apparatus 100 generates a nodeless tree by using the information stored in the header section of the compression file and conducts internal coding on the compressed code data in the compression file by using the generated nodeless tree. However, this is not a limitation, and when a source program is compressed, the information processing apparatus 100 may write the compressed code data on the source program into the compression file and, in addition, write the nodeless tree and the internal-code correspondence table 410 into the trailer section of the compression file. Thus, the information processing apparatus 100 does not need to generate a nodeless tree when a compressed source program is executed and it may conduct subsequent internal coding on the compressed code data by only reading out a nodeless tree, and furthermore the execution speed of the interpreter may be improved.

Furthermore, the operation procedures, the control procedures, the specific names, and the information including various types of data and parameters as described in the embodiment may be arbitrarily changed except as otherwise noted.

[Hardware Configuration of the Information Processing Apparatus]

Figure 13:
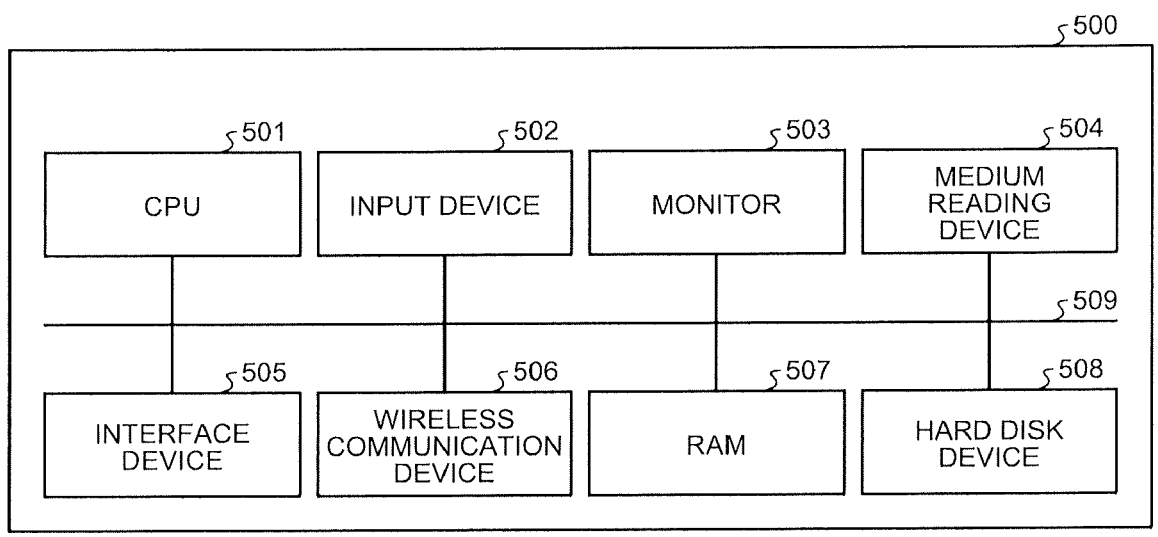
FIG. 13 is a diagram that illustrates a hardware configuration of the information processing apparatus according to the embodiment.

FIG. 13 is a diagram that illustrates a hardware configuration of the information processing apparatus according to the embodiment. As illustrated in the example of FIG. 13, a computer 500 includes a CPU 501 that performs various types of arithmetic processing; an input device 502 that receives data input from users; and a monitor 503. Furthermore, the computer 500 includes a medium reading device 504 that reads programs, or the like, from a storage medium; an interface device 505 for connecting to a different device; and a wireless communication device 506 for wirelessly connecting to a different device. Furthermore, the computer 500 includes a RAM 507 that temporarily stores various types of information; and a hard disk device 508. Furthermore, each of the devices 501 to 508 is connected to a bus 509.

The hard disk device 508 stores a compression processing program that has the same functionality as each processing unit, such as the lexical analysis unit 220, the appearance-frequency aggregation unit 230, the nodeless-tree generation unit 240, or the compression coding unit 250, illustrated in FIG. 9. Furthermore, the hard disk device 508 stores an execution processing program that has the same functionality as each processing unit, such as the nodeless-tree generation unit 320, the internal-code conversion unit 330, the syntax analysis unit 340, or the interpreter execution unit 350, illustrated in FIG. 10. Moreover, the hard disk device 508 stores various types of data for executing information processing programs including the compression processing program and the execution processing program.

The CPU 501 reads each program stored in the hard disk device 508 and loads it into the RAM 507 to execute it, thereby performing various processes. These programs may cause the computer 500 to function as for example the lexical analysis unit 220, the appearance-frequency aggregation unit 230, the nodeless-tree generation unit 240, and the compression coding unit 250, illustrated in FIG. 9. These programs may cause the computer 500 to function as for example the nodeless-tree generation unit 320, the internal-code conversion unit 330, the syntax analysis unit 340, and the interpreter execution unit 350, illustrated in FIG. 10.

Furthermore, the above-described information processing program does not always need to be stored in the hard disk device 508. For example, the computer 500 may read and execute the program that is stored in a storage medium readable by the computer 500. The storage medium readable by the computer 500 is equivalent to, for example, a portable recording medium, such as CD-ROM, DVD disk, or USB (Universal Serial Bus) memory, a semiconductor memory, such as a flash memory, a hard disk drive, or the like. Furthermore, the program may be stored in a device connected to a public network, the Internet, the LAN (Local Area Network), or the like, so that the computer 500 reads the program from it and executes it.

Figure 14:
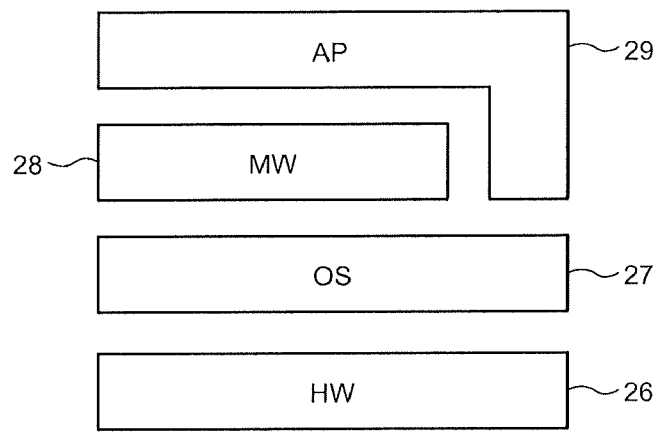
FIG. 14 is a diagram that illustrates an example of the configuration of the program executed in a computer.

FIG. 14 is a diagram that illustrates an example of the configuration of the program executed in the computer. In the computer 500, an OS (operating system) 27 is executed to perform control on a group of hardware 26 (501 to 509) illustrated in FIG. 14. The CPU 501 is operated with the procedure in accordance with the OS 27 so as to perform control/management on the group of hardware 26, whereby processing is performed by the group of hardware 26 in accordance with an application program 29 or middleware 28. Furthermore, in the computer 500, the middleware 28 and the application program 29 are read into the RAM 407 and executed by the CPU 501.

If a word to be encoded by the CPU 501 is received, the information processing functions of the compression unit 200 and the execution unit 300 are implemented by performing processing based on at least part of the middleware 28 and the application program 29 (by controlling the group of hardware 26 based on the OS 27 for the processing). Each of the information processing functions may be included in the application program 29 itself, or it may be part of the middleware 28 executed by being invoked in accordance with the application program 29.

According to one aspect, the execution speed of the interpreter for interpreter-type source codes may be improved.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus comprising:
a processor configured to:
conduct lexical analysis on a source code;
for each word of the source code that has undergone the lexical analysis, generate a tree structure whose leaf includes a compression code related to each word, an attribute, and a pointer to an internal code;
compress the source code, on which the lexical analysis has been conducted, by using the tree structure and a compression dictionary that associates the internal code and the compression code, to generate compressed source code;
when an execution command of an interpreter is received for the compressed source code, convert the compressed source code into the internal code in accordance with the compression dictionary, the internal code being used when the interpreter is executed;
execute syntax analysis on the compressed source code based on the internal code, in accordance with the attribute corresponding to the word registered in the tree structure; and
sequentially execute interpreter processing in accordance with the internal code.

2. The information processing apparatus according to claim 1, wherein the processor is further configured to store each word, of which the lexical analysis has been conducted on the source code, in relation to the attribute and an appearance frequency in the source code, in a header section of a compression file of the compressed source code.

3. An information processing method comprising:
conducting lexical analysis on a source code, by a processor;
for each word of the source code that has undergone the lexical analysis, generating a tree structure whose leaf includes a compression code related to each word, an attribute, and a pointer to an internal code;
compressing the source code, on which the lexical analysis has been conducted, by using the tree structure and a compression dictionary that associates the internal code and the compression code, to generate compressed source code, by the processor;
when an execution command of an interpreter is received for the compressed source code, converting the compressed source code into the internal code in accordance with the compression dictionary, by the processor, the internal code being used when the interpreter is executed;
executing syntax analysis on the compressed source code based on the internal code, in accordance with the attribute corresponding to the word registered in the tree structure; and
sequentially executing interpreter processing in accordance with the internal code, by the processor.

4. A non-transitory computer-readable recording medium storing an information processing program that causes a computer to execute a process comprising:
conducting lexical analysis on a source code;
for each word of the source code that has undergone the lexical analysis, generating a tree structure whose leaf includes a compression code related to each word, an attribute, and a pointer to an internal code;
compressing the source code, on which the lexical analysis has been conducted, by using the tree structure and a compression dictionary that associates the internal code and the compression code, to generate compressed source code;
when an execution command of an interpreter is received for the compressed source code, converting the compressed source code into the internal code in accordance with the compression dictionary, by the processor, the internal code being used when the interpreter is executed;
executing syntax analysis on the compressed source code based on the internal code, in accordance with the attribute corresponding to the word registered in the tree structure; and
sequentially executing interpreter processing in accordance with the internal code.

* * * * *